United States Patent [19]

Mruk

[11] Patent Number: 4,776,659
[45] Date of Patent: Oct. 11, 1988

[54] OPTICAL COUPLER INTEGRATED WITH LIGHT EMITTER AND DETECTOR UNITS

[76] Inventor: Walter S. Mruk, 105 Meyersville Rd., Chatam Township, Morris County, N.J. 07928

[21] Appl. No.: 800,412

[22] Filed: Nov. 21, 1985

[51] Int. Cl.⁴ .............................................. G02B 6/26
[52] U.S. Cl. ........................ 350/96.15; 350/96.20
[58] Field of Search ............... 350/96.15, 96.18, 96.20

[56] References Cited

U.S. PATENT DOCUMENTS

| | | | |
|---|---|---|---|
| 3,825,319 | 7/1974 | Cook et al. | 350/96.15 |
| 4,188,087 | 2/1980 | D'Auria et al. | 350/96.15 X |
| 4,270,049 | 5/1981 | Tanaka et al. | 350/96.15 X |

FOREIGN PATENT DOCUMENTS 3241155  5/1984  Fed. Rep. of Germany ... 350/96.23

*Primary Examiner*—Gene Wan
*Attorney, Agent, or Firm*—Michael Ebert

[57] ABSTRACT

An optical isolator that includes a light emitter unit for converting an input electric signal to a corresponding light signal and a light detector unit for converting the light signal to a corresponding output electric signal, both units having a casing of the same diameter and a central port. The emitter unit is optically joined to the detector unit by a coupler formed of concentric layers of transparent dielectric material constituted by a core disposed within a cladding tube of the same length to define a light pipe and a sleeve surrounding the tube and projecting therefrom at either end to define input and output sockets to snugly receive the units with the ports thereof in juxtaposition to the opposite ends of the core. The core and the cladding tube of the light pipe have different indexes of refraction, whereby light from the emitter unit is propagated by multiple internal reflections to the detector unit. The sleeve has a different index of refraction from that of the tube, whereby the interface therebetween is reflective with respect to external light.

9 Claims, 1 Drawing Sheet

U.S. Patent
Oct. 11, 1988
4,776,659
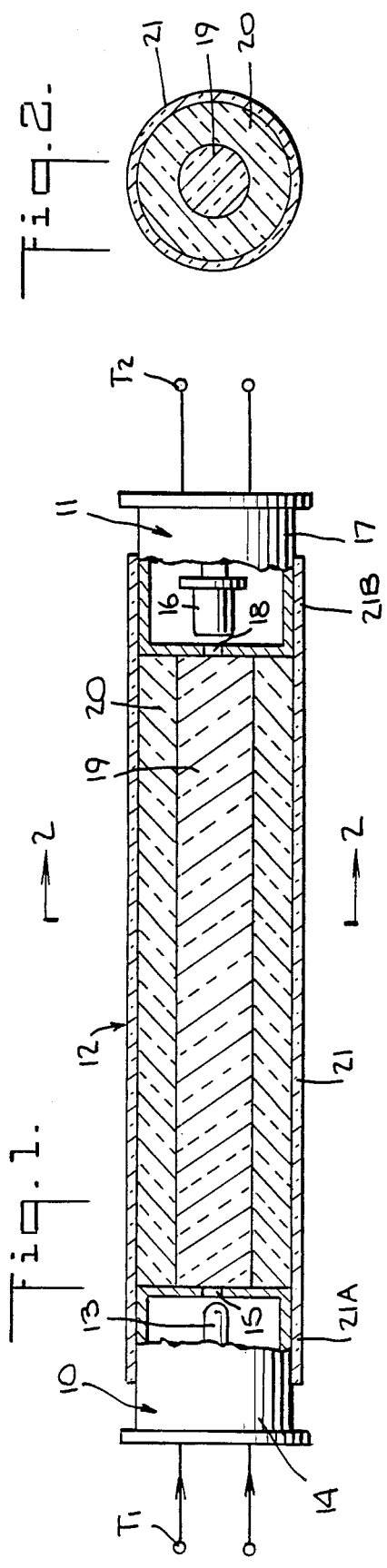
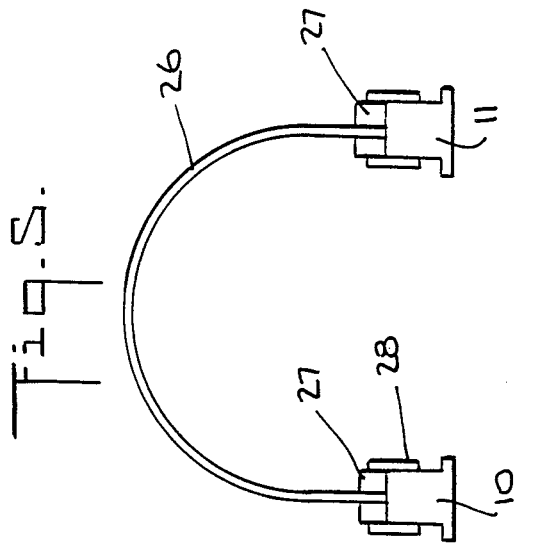
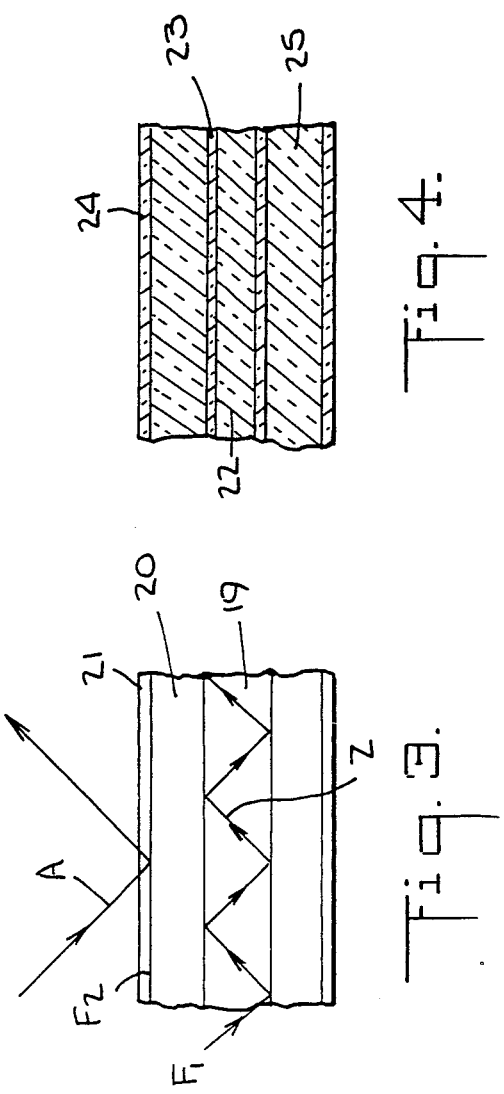

OPTICAL COUPLER INTEGRATED WITH LIGHT EMITTER AND DETECTOR UNITS

BACKGROUND OF INVENTION

1. Field of Invention

This invention relates generally to optical isolators, and in particular to an isolator in which a light emitter unit and a light detector unit are joined to opposite ends of a dielectric coupler having fiber optic characteristics whereby light from the emitter is propagated by multiple internal reflections to the detector.

2. Status of Art

An optical isolator, also known as an optically-coupled isolator or as an opto-isolator is a four terminal electronic circuit element constituted by a light emitter, a light detector and a dielectric medium therebetween that is transmissive of the optical wavelengths of the emitted light. All these components are in an integrated package, the arrangement being such that the only optical emission impinging on the detector is that emanating from the emitter.

In an optical isolator, an input electric signal is converted by the emitter into a corresponding light signal, and this light signal is intercepted by the detector to be converted into a corresponding output signal. An optical isolator is commonly used between two circuits of a system having a large voltage difference therebetween when it becomes necessary to convey a small signal between the two circuits without changing the basic voltage level of either circuit.

The light emitter in an optical isolator is usually a light emitting diode (LED) formed of gallium arsenide which emits in the infrared or near infrared region of the spectrums. The light detector isolator is usually a photodiode or phototransistor.

In fabricating a conventional otical isolator, the output port of the emitter must be disposed in axial alignment with the input port of the detector, the emitter and the detector being housed in a single hermetically-sealed package or in separate hermetic housings within a common package of non-hermetic design. The fabrication of conventional isolators is made difficult by the need to exactly align the emitter and detector; for should they be misaligned, the isolator will be inoperative.

SUMMARY OF INVENTION

In view of the foregoing, the main object of this invention is to provide an optical isolator in which a light emitter unit and a light detector unit are joined to opposite ends of a dielectric coupler having fiber optic properties.

More particularly, an object of this invention is to provide an optical isolator of the above type which functions efficiently to propagate light from a light emitter unit to a light detector unit by multiple internal reflections through a fiber optic light pipe.

A significant feature of the invention is that the dielectric coupler which joins the light detector and light emitter units is provided with end sockets to snugly receive these units and at the same time align the ports thereof with a fiber optic light pipe incorporated in the coupler.

Also an object of this invention is to provide an optical isolator which may be fabricated without difficulty and produced at relatively low cost.

Briefly stated, these objects are attained in an optical isolator that includes a light emitter unit for converting an input electric signal to a corresponding light signal and a light detector unit for converting the light signal to a corresponding output electric signal, both units having a casing of the same diameter and a central port. The emitter unit is optically joined to the detector unit by a coupler formed of concentric layers of transparent dielectric material constituted by a core disposed within a cladding tube of the same length to define a light pipe and a sleeve surrounding the tube and projecting therefrom at either end to define input and output sockets to snugly receive the units with the ports thereof in juxtaposition to the opposite ends of the core. The core and the cladding tube of the light pipe have different indexes of refraction, whereby light from the emitter unit is propagated by multiple internal reflections to the detector unit. The sleeve has a different index of refraction from that of the tube, whereby the interface therebetween is reflective with respect to external light.

OUTLINE OF DRAWINGS

For a better understanding of the invention as well as other objects and further features thereof, reference is made to the following detailed description to be read in conjunction with the accompanying drawings, wherein:

FIG. 1 is a longitudinal section taken through a preferred embodiment of an optical isolator in accordance with the invention;

FIG. 2 is a transverse section taken in the plane indicated by line 2—2 in FIG. 1;

FIG. 3 schematically illustrates the operation of the dielectric coupler included in the optical isolator;

FIG. 4 is a longitudinal section taken through the dielectric coupler in another embodiment of the invention; and FIG. 5 illustrates still another embodiment of the invention.

DESCRIPTION OF INVENTION

First Embodiment

Referring now to FIGS. 1 and 2, there is shown an optical isolator in accordance with the invention, the isolator including a light emitter unit 10, a light detector unit 11 and a dielectric coupler 12 joining the emitter unit to the detector unit.

Light emitter unit 10 is provided with a light emitting diode (LED) 13 coaxially supported within a cylindrical casing 14, the casing having a central front port 15 through which light from the LED is projected. An electric input signal applied to input terminals $T_1$ is fed to the LED to produce a corresponding light signal.

Light detector unit 11 is provided with a phototransistor or photodiode 16 housed within a casing 17 having a central front port 18 to expose the photodiode 16 to an incoming light signal to produce a corresponding electric output signal which is yielded at output terminals $T_2$. The casings of the light emitter and light detector units 10 and 11 have the same diameter.

Coupler 12 is composed of concentric layers of transparent dielectric material having different indexes of refraction. The coupler is constituted by a central core 19 disposed within a cladding tube 20 to define a light pipe, and a sleeve 21 surrounding tube 20 and projecting from either end thereof to define an input socket 21A and an output socket 21B. The internal diameter of sleeve 21 substantially matches the outer diameter of casings 14 and 17. Units 10 and 11 are snugly received in the input and output sockets 21A and 21B, respectively, with the ports 15 and 18 in juxtaposition to the opposite ends of core 19.

Since the light pipe formed by core 19 and cladding tube 20 has fiber optic properties, the principles underlying the transmission of light by an optical fiber will now be briefly reviewed. These principles come into play, not only with respect to the light pipe, but also in regard to the optical properties of sleeve 21 in relation to tube 20 which it surrounds. A long polished cylinder of glass or transparent acrylic plastic material is capable of transmitting light from one end to the other without leakage, provided the light strikes the wall of the cylinder with an angle of incidence greater than the critical angle for total internal reflection. In transmission, as shown in FIG. 3, where core 20 is equivalent to this rod, light travels in a zig-zag path Z of successive multiple internal reflections.

For light to be transmitted without reflection loss, it is necessary that the angle $\theta$ exceed the critical angle in accordance with the following equation:

$$\sin \theta = N_2/N_1$$

where $N_1$ is the refractive index of the cylinder (core 20), and $N_2$, the refractive index of the medium surrounding the cylinder which, in this instance, is cladding tube 21. From this, one can determine that the maximum internal slope of a light ray which is to be totally reflected is:

$$\sin U = N_0 \sqrt{N_1^2 - N_2^2}$$

where U is the angle of incidence of the incoming ray at the input end of the cylinder and $N_o$ is the refractive index of the medium at the input end. This acceptance zone of a cylinder is often referred to as the numerical aperture.

If the light-transmitting cylinder is bent into a moderate curve, a certain amount of light will leak out of the sides of the cylinder. However, the major portion of the light is still trapped within the cylinder where it undergoes multiple reflections. It is for this reason that a bent rod made of glass or plastic may be used to conduct light from one point to another in a curved path.

The refractive index of air is 1, which is less than that of any solid. Thus, the refractive index of crown glass is 1.517; that of quartz is 1.544; fused silica 1.459; Lucite (polymethyl methacrylate) 1.49, and Teflon (TFE) 1.35. Hence, a transparent glass or plastic rod suspended in air is capable of transmitting light by internal reflection. However, it is not practical to use a naked rod for this purpose, for dust and other surface contaminants will scatter a certain amount of light incident to the interface of the rod and air. Hence, in a typical fiber optic line, th light conducting core is provided with a cladding having a refractive index lower than that of the core. Since light traveling down a fiber actually penetrates the cladding a few wavelengths, the cladding necessarily must be transparent.

From the foregoing, it is evident that the best light pipe has a core of the highest possible refractive index and a cladding of the lowest possible refractive index.

One form of flexible light pipe that is commercially available is the "CROFON" light guide manufactured by du Pont consisting of a core of polymethyl methacrylate sheathed in a cladding tube formed of polyethylene. The core in this instance has a refractive index of 1.49 and the cladding 1.43.

In the structure shown in FIG. 1, use is preferably made of fused silica for the core 19 and a fused silica for the cladding tube 20, which is doped to impart thereto a lower refractive index than that of the core. The outer sleeve 21 is also of fused silica whose refractive index is higher than that of the doped silica tube 20. Hence, as shown in FIG. 3, multiple internal reflections Z take place at the interface $F_1$ on the core and cladding tube to cause light to be propagated through the core. However, the interface $F_2$ between tube 20 and sleeve 21 is reflective with respect to external light A, so that ambient light will not be admitted into the light pipe, and there will be no interference from external light sources.

The advantage of a transparent sleeve over a sleeve that is opaque or has an opaque coating to exclude light is that with a transparent sleeve of silica, quartz or other transparent dielectric material, this sleeve lends itself to vacuum or environmental fusion which would not be possible should one use an opaque plastic coating on the sleeve.

By using silica material for the respective layers of the dielectric coupler, because these materials have essentially the same thermal coefficients of expansion, the isolator can withstand extreme operating temperature ranges. However, the isolator is limited to the temperatures that the active devices (the emitter and detector) can tolerate.

In practice, the layers of the dielectric coupler can be thermally fused together or interbonded using conventional clear epoxies for this purpose. The emitter and detector units are sealed in their sleeve sockets by an epoxy having hermetic sealing properties, so that the isolator, regardless of its length, is hermetically sealed.

Because of the geometry of the isolator, there is no problem in alignment; for when light-emitter unit 10 is nested in socket 21A of the sleeve, its port 15 is then properly aligned with the longitudinal axis of the core 19 of the fiber optic light pipe 19, the same result being obtained when light detector 11 is nested in its socket 21B. In practice, a sealant may be used to envelop the exposed ends of the casings of the unit, this sealant being joined to the exterior of sockets 21A and 21B.

Other Embodiments

In the embodiment shown in FIG. 4, the light pipe is formed by a core 22 and a cladding tube 23 which is relatively thin, these having different indexes of refraction to provide multiple internal reflections. And in order to fill the space between the outer sleeve 24 and tube 23, an intermediate tubular layer 25 is provided, all of these layers being interbonded. The refractive index of sleeve 24 is greater than that of the intermediate layer 25 so that the interface therebetween is reflective with respect to external light rays impinging on the isolator.

In order to provide an optical isolator which may be bent to traverse a curved path, the isolator shown in FIG. 5 makes use of a flexible fiber optic light pipe 26 having a core covered by a cladding tube such as the du Pont CORFON light guide previously described.

Light pipe 26 is embedded coaxially at either end in an inner collar 27. This collar is surrounded by and bonded to an outer collar 28 of greater length to define a socket for accommodating the related unit (10 and 11) so that the port in the unit abuts the end of the light pipe, thereby aligning the port with the light pipe as in the first embodiment.

While there have been shown and described preferred embodiments of an integrated optical isolator in accordance with the invention, it will be appreciated that many changes and modifications may be made therein, without, however, departing from th essential spirit thereof.

Thus, while the invention has been described as requiring emitter and detector units whose casings have the same diameter so that they both fit snugly in the end sockets of the sleeve, in practice, when commercially available units are used, the casing of one may have a smaller diameter than the other. In that situation, in order to have matching casings, the smaller casing is provided with a collar that is bonded thereto to enlarge its diameter to correspond to the diameter of the larger casing.

Also, while the sleeve has been described as having a higher refractive index from that of the tube, in practice the index of the sleeve may be the same or lower than that of the tube when there is no need to exclude external light from the isolator.

I claim:

1. An optical isolator comprising:
   A. a light emitter unit having a cylindrical casing and a central port from which light is emitted;
   B. a light detector unit having a cylindrical casing and a central port through which incoming light passes, the casings of said units having the same external diameter; and
   C. a coupler formed of concentric layers of transparent dielectric material including an inner core disposed within a cladding tube of the same length to define a light pipe and a sleeve surrounding the light pipe having an internal diameter essentially matching the external diameter of the casings of the units and having a length greater than that of the light pipe causing the sleeve to project beyond the light pipe at either end thereof to define input and output sockets in which said units are snugly received with the ports thereof in juxtaposition to the ends of the core, the core and the tube having different indexes of refraction whereby light from the emitter unit is propagated by multiple internal reflections to the detector unit, said sleeve having an index of refraction which renders the coupler reflective with respect to external light so that interfering ambient light is excluded from the light pipe.

2. An isolator as set forth in claim 1, wherein said emitter unit is provided with a light-emitting diode which converts an input electric signal to a corresponding light signal.

3. An isolator as set forth in claim 2, wherein said emitter unit is provided with a photodiode which converts an incoming light signal to a corresponding output electric signal.

4. An isolator as set forth in claim 1, wherein said sleeve is contiguous with said tube and has an index of refraction which is different from that of the tube to render the interface therebetween reflective with respect to external light.

5. An isolator as set forth in claim 1, wherein said sleeve is spaced from the tube to define an annular space therebetween that is filled by a transparent tubular intermediate layer.

6. An isolator as set forth in claim 5, wherein said sleeve has an index of refraction which differs from that of the intermediate layer to render the interface therebetween reflective with respect to external light.

7. An isolator as set forth in claim 1, wherein said cor is formed of fused silica.

8. An isolator as set forth in claim 7, wherein said cladding tube is formed of doped fused silica.

9. An isolator as set forth in claim 8, wherein said sleeve is formed of fused silica.

* * * * *